(12) United States Patent
Song et al.

(10) Patent No.: US 8,653,628 B1
(45) Date of Patent: Feb. 18, 2014

(54) POWER SEMICONDUCTOR DEVICE AND METHOD OF MANUFACTURING THE SAME

(71) Applicant: Samsung Electro-Mechanics Co., Ltd., Gyunggi-do (KR)

(72) Inventors: In Hyuk Song, Gyunggi-do (KR); Jae Hoon Park, Gyunggi-do (KR); Dong Soo Seo, Gyunggi-do (KR)

(73) Assignee: Samsung Electro-Mechanics Co., Ltd., Gyunggi-Do (KR)

( * ) Notice: Subject to any disclaimer, the term of this patent is extended or adjusted under 35 U.S.C. 154(b) by 0 days.

(21) Appl. No.: 13/688,320

(22) Filed: Nov. 29, 2012

(51) Int. Cl.
*H01L 29/00* (2006.01)
(52) U.S. Cl.
USPC ............ 257/579; 257/341; 257/E21.135; 438/561
(58) Field of Classification Search
USPC ............ 438/561; 257/152, 153, 502, 579, 257/E21.045, E21.466
See application file for complete search history.

(56) References Cited

U.S. PATENT DOCUMENTS

| | | | |
|---|---|---|---|
| 2005/0029586 A1 | 2/2005 | Ono et al. | 257/330 |
| 2005/0056890 A1* | 3/2005 | Yasuhara et al. | 257/341 |
| 2011/0180813 A1 | 7/2011 | Harada et al. | 257/77 |

FOREIGN PATENT DOCUMENTS

DE 102007043341 A1 9/2007

OTHER PUBLICATIONS

Office Action issued for related German Patent Application No. 10 2012 111 503.6, dated Apr. 29, 2013 and English translation provided by the Applicant.

* cited by examiner

*Primary Examiner* — Cheung Lee
(74) *Attorney, Agent, or Firm* — Ladas & Parry, LLP

(57) ABSTRACT

Disclosed herein is a power semiconductor device including: a base substrate having one surface and the other surface and formed of a first conductive type drift layer; a first conductive type diffusion layer formed on one surface of the base substrate and having a concentration higher than that of the first conductive type drift layer; and a trench formed so as to penetrate through the second conductive type well layer and the first conductive type diffusion layer from one surface of the base substrate including the second conductive type well layer in a thickness direction.

6 Claims, 7 Drawing Sheets

POWER SEMICONDUCTOR DEVICE AND METHOD OF MANUFACTURING THE SAME

CROSS REFERENCE TO RELATED APPLICATION

This application claims the benefit of Korean Patent Application No. 10-2012-0095649, filed on Aug. 30, 2012, entitled "Power Semiconductor Device and Method of Manufacturing the Same", which is hereby incorporated by reference in its entirety into this application.

BACKGROUND OF THE INVENTION

1. Technical Field

The present invention relates to a power semiconductor device and a method of manufacturing the same.

2. Description of the Related Art

Recently, in accordance with significant development of various forms of insulated gate bipolar transistor (IGBT) devices including an IGBT disclosed in Patent Document 1, applications have been widely used for a large capacity of industry and an electric car as well as a home appliance.

The largest advantage of the IGBT device is that the IGBT device performs a bipolar operation unlike a metal oxide semiconductor (MOS) field-effect transistor, wherein this bipolar operation generates conductivity modulation phenomenon to reduce series resistance depending on a raw material of a wafer at the time of a turn-on operation of the IGBT device, such that conduction loss is significantly reduced as compared with the MOSFET with respect to high withstand voltage and high current products, thereby making it possible to reduce power loss.

Therefore, in accordance with the recent trend of the IGBT technology, a technology capable of maximizing a conductivity modulation shape has been developed. To this end, a technology of accumulating hole carriers has been mainly used. The hole carriers are generated by holes injected from a P-collector layer and are gradually decreased toward an emitter layer, such that a ratio of the conduction loss is increased toward the emitter layer.

To solve this problem, a technology of reducing a width of a trench to trench (MESA) region, which becomes a final movement path of the hole carriers, to limit movement of the hole carriers has been applied.

[PRIOR ART DOCUMENT]

[Patent Document]

(Patent Document 1) US 2011-0180813 A

SUMMARY OF THE INVENTION

The present invention has been made in an effort to provide a power semiconductor device capable of maximizing a conductivity modulation shape, and a method of manufacturing the same.

According to a preferred embodiment of the present invention, there is provided a method of manufacturing a power semiconductor device, the method comprising: preparing a base substrate having one surface and the other surface and formed of a first conductive type drift layer; forming an etching resist on one surface of the base substrate, the etching resist having an open part for forming a trench; forming a primary trench corresponding to the open part from one surface of the base substrate in a thickness direction; performing ion injection and thermal diffusion on the primary trench to form a first conductive type diffusion layer having a concentration higher than that of the first conductive type drift layer; and forming a secondary trench extended from a lower surface of the primary trench to the thickness direction and penetrating through the first conductive type diffusion layer, wherein a peak point of an impurity doping profile of the first conductive type diffusion layer according to the ion injection is positioned between one surface of the base substrate and a lower surface of the secondary trench.

The first conductive type diffusion layer may be formed in a semicircular shape at each of both sides of the primary and secondary trenches based on the primary and secondary trenches.

The method may further include, after the forming of the secondary trench, removing the etching resist.

The method may further include: after the removing of the etching resist, forming a first insulating film on one surface of the base substrate as well as an inner wall of the primary and secondary trenches; forming a first electrode in the primary and secondary trenches; and forming a second conductive type well layer on the first conductive type diffusion layer.

The first conductive type may be an N-type and the second conductive type may be a P-type.

The method may further include: after the removing of the etching resist and before the forming of the first insulating film, forming a second insulating film on the base substrate as well as the inner wall of the primary and secondary trenches; and removing the second insulating film.

The first insulating film may be a gate oxide film, and the second insulating film may be a sacrificial oxide film.

The method may further include: after the forming of the second conductive type well layer, forming second electrode regions on the second conductive type well layer and on each of the outer wells of both sides of a plurality of primary and secondary trenches; forming a second conductive type body region on the second conductive type well layer and between the second electrode regions, the second conductive type body region having a concentration higher than that of the second conductive type well layer; forming a third insulating film on the primary trench in one surface of the base substrate so as to contact the first insulating film and the first electrode; and forming a second electrode on one surface of the base substrate as well as the third insulating film, wherein the primary and secondary trenches are plural.

The method may further include, after the forming of the second electrode, forming a second conductive type semiconductor substrate on a lower surface of the first conductive type drift layer based on a thickness direction of the base substrate.

The second electrode region may be a first conductive type emitter region, and the second electrode may be an emitter electrode.

The peak point of the impurity doping profile of the first conductive type diffusion layer according to the ion injection may be positioned between a region below the second conductive type well layer and a lower surface of the secondary trench based on a thickness direction of the power semiconductor device.

In the forming of the etching resist, the etching resist may be made of an oxide material.

According to another preferred embodiment of the present invention, there is provided a power semiconductor device including: a base substrate having one surface and the other surface and formed of a first conductive type drift layer; a semiconductor substrate formed on the other surface of the base substrate; a first conductive type diffusion layer formed on one surface of the base substrate and having a concentration higher than that of the first conductive type drift layer; a second conductive type well layer formed on the first conductive type diffusion layer; a trench formed so as to penetrate through the second conductive type well layer and the first conductive type diffusion layer from one surface of the base substrate including the second conductive type well layer in a thickness direction; a first insulating film formed on one surface of the base substrate as well as an inner wall of the trench; and a first electrode formed in the trench, wherein a peak point of an impurity doping profile of the first conductive type diffusion layer is positioned between a region below the second conductive type well layer and a lower surface of the trench.

The first conductive type may be an N-type and the second conductive type may be a P-type.

The first conductive type diffusion layer may be formed in a semicircular shape at each of both sides of the trench based on the trench.

The first insulating film may be a gate oxide film.

The power semiconductor device may further include: second electrode regions formed on the second conductive type well layer and each of the outer wells of both sides of the plurality of trenches; a second conductive type body region formed on the second conductive type well layer and between the second electrode regions and having a concentration higher than the second conductive type well layer; a third insulating film formed on the trench of one surface of the base substrate so as to contact the first insulating film and the first electrode; and a second electrode formed on one surface of the base substrate as well as the third insulating film, wherein the trenches are plural.

The second electrode region may be a first conductive type emitter region, and the second electrode may be an emitter electrode.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

Figure 1:
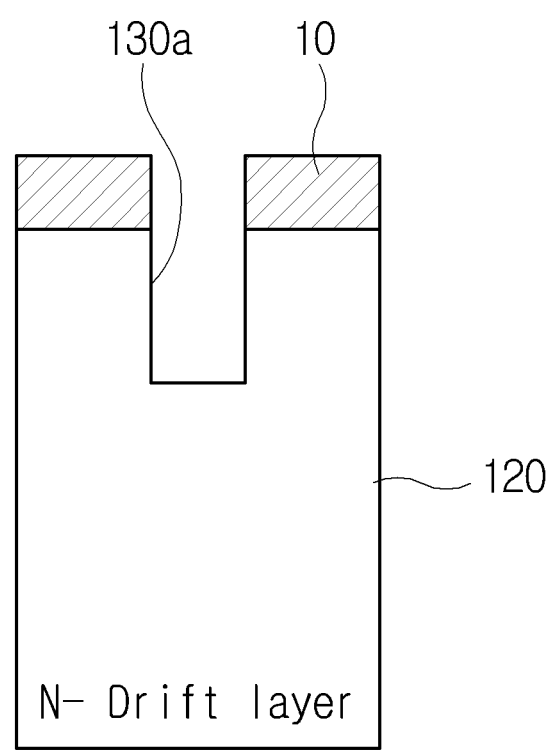
FIGS. 1 to 6 are cross-sectional views sequentially showing processes of a method of manufacturing a power semiconductor device according to a preferred embodiment of the present invention.

The objects, features and advantages of the present invention will be more clearly understood from the following detailed description of the preferred embodiments taken in conjunction with the accompanying drawings. Throughout the accompanying drawings, the same reference numerals are used to designate the same or similar components, and redundant descriptions thereof are omitted. Further, in the following description, the terms "first", "second", "one side", "the other side" and the like are used to differentiate a certain component from other components, but the configuration of such components should not be construed to be limited by the terms. Further, in the description of the present invention, when it is determined that the detailed description of the related art would obscure the gist of the present invention, the description thereof will be omitted.

Hereinafter, preferred embodiments of the present invention will be described in detail with reference to the attached drawings.

A power semiconductor device disclosed in the preferred embodiment of the present invention represents an insulated gate bipolar transistor (IGBT). However, the present invention is not limited thereto.

Method of Manufacturing Power Semiconductor Device

Figure 4:
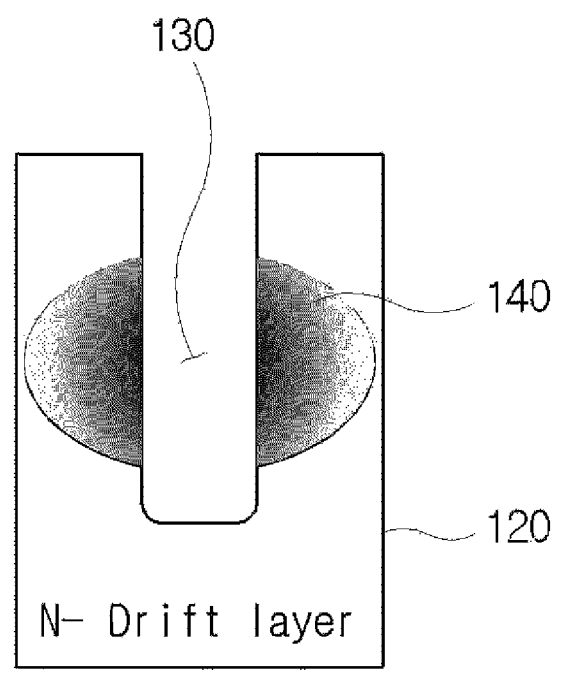
Figure 5:
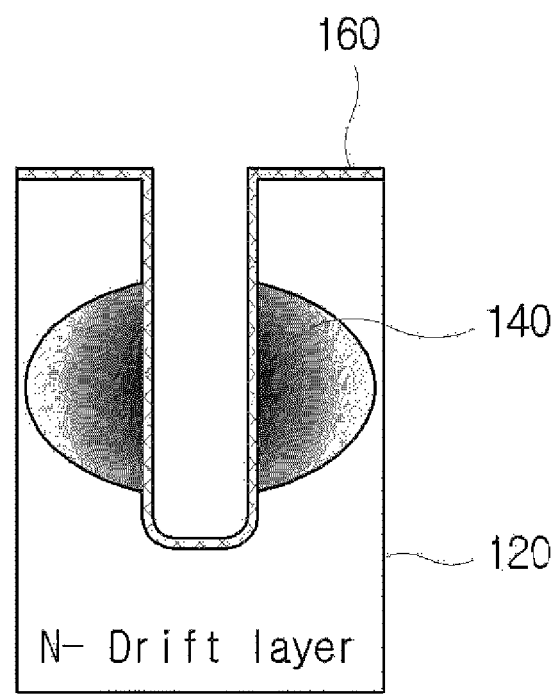
Figure 6:
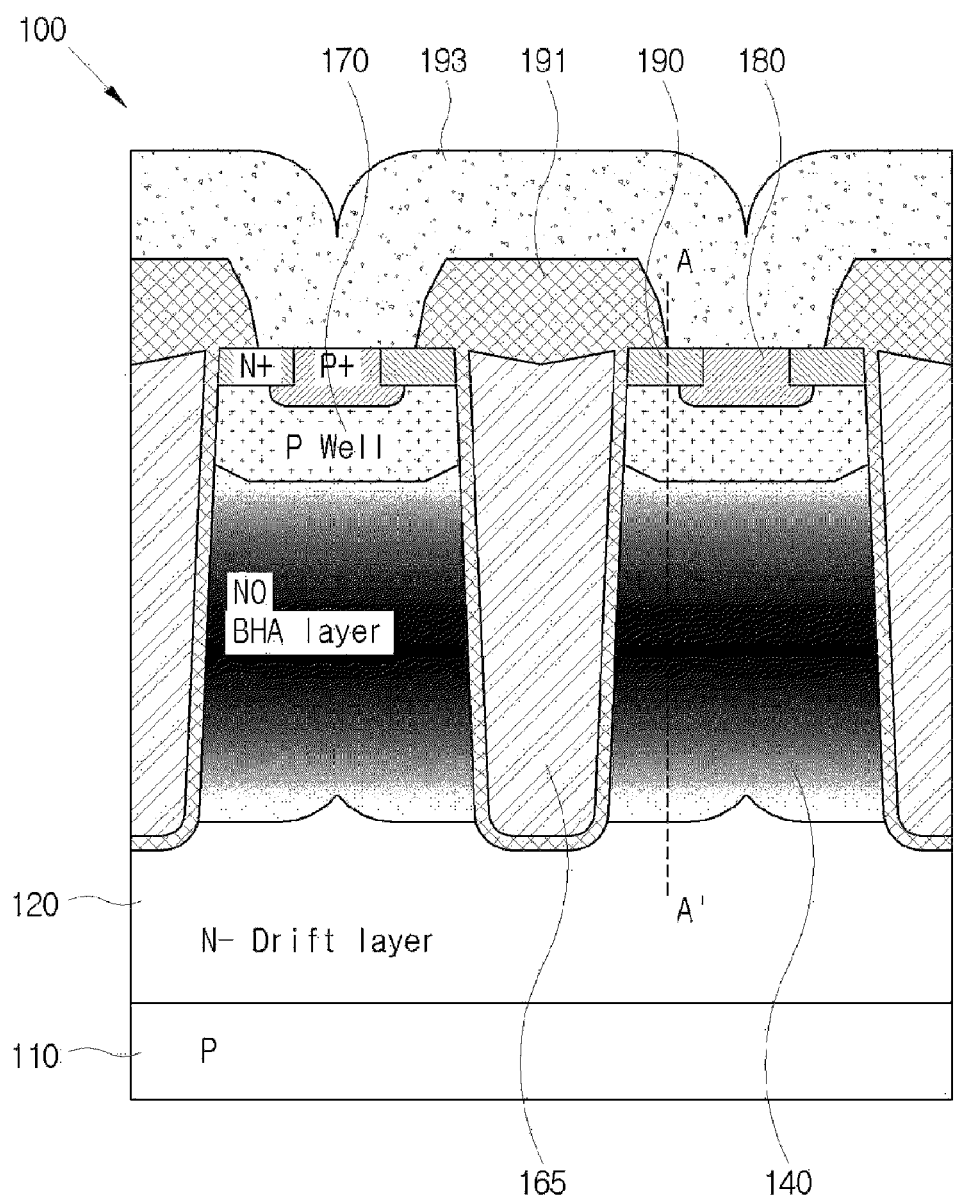
Figure 7:
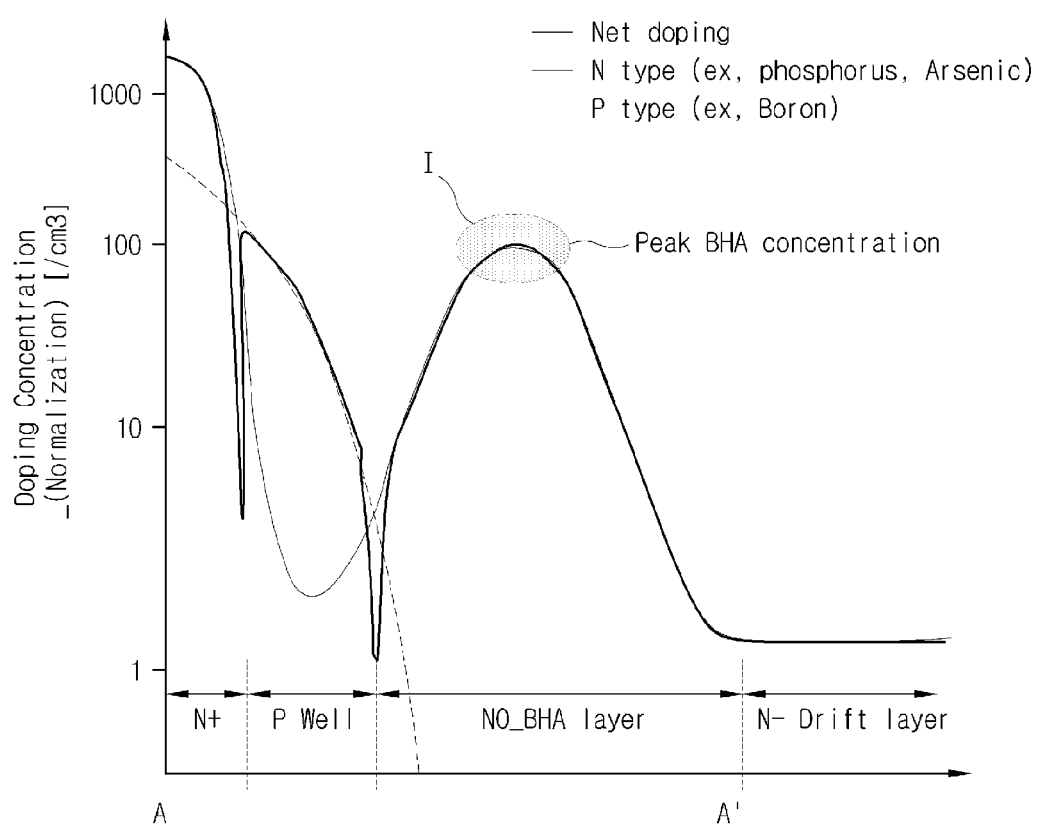
FIG. 7 is a graph showing doping profiles of each region based on the line A-A' of the semiconductor device of FIG. 6.

FIGS. 1 to 6 are cross-sectional view sequentially showing processes of a method of manufacturing a power semiconductor device according to a preferred embodiment of the present invention, and FIG. 7 is a graph showing doping profiles of each region based on a line A-A' of the semiconductor device of FIG. 6.

First, referring to FIG. 1, a base substrate having one surface and the other surface and formed of a first conductive type drift layer 120 may be prepared.

In this case, the first conductive type may be an N-type and the first conductive type drift layer 120 may be an N-drift layer, but the present invention is not limited thereto.

Next, referring to FIG. 1, an etching resist 10 having an open part for forming a trench may be formed on one surface of the base substrate.

The etching resist 10 may be made of an oxide material.

Since the etching resist 10 is made of the oxide material, it is possible to subsequently perform ion injection and thermal diffusion processes.

Further, since the etching resist 10 is made of the oxide material, all of the primary and secondary trenches 130a and 130b may be processed using a single etching resist 10.

Next, referring to FIG. 1, the primary trench 130a corresponding to the open part may be formed from one surface of the base substrate in a thickness direction.

Figure 2:
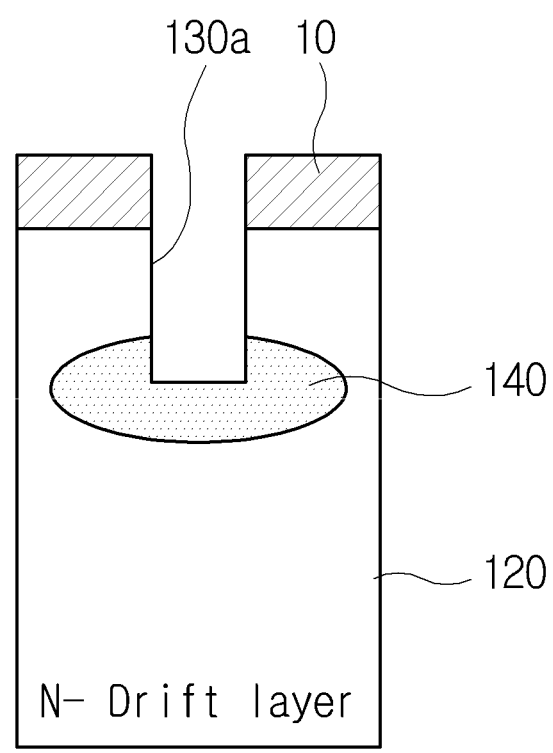
Figure 3:
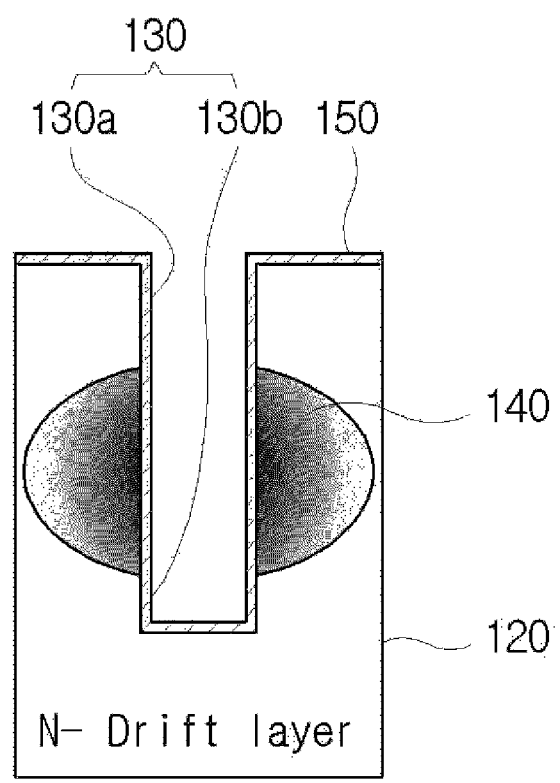

Next, referring to FIGS. 2 and 3, the ion injection and thermal diffusion processes are performed on the primary trench 130a, thereby making it possible to form a first conductive type diffusion layer 140 having a concentration higher than that of the first conductive type drift layer 120.

In this case, the first conductive type diffusion layer 140 may be an NO-type diffusion layer having the concentration higher than that of the N-type of the first conductive type drift layer 120, but the present invention is not limited thereto.

Next, referring to FIG. 3, a second trench 130b may be formed so as to be extended from a lower surface of the primary trench 130a in a thickness direction and penetrate through the first conductive type diffusion layer 140.

That is, as shown in FIG. 3, the trench 130 may be formed by performing the trench processing twice.

Further, a peak point of an impurity doping profile of the first conductive type diffusion layer 140 according to the above-mentioned ion injection may be positioned at a region between one surface of the base substrate and a lower surface of the secondary trench 130b.

More specifically, the peak point (a region in which the doping concentration is the most deeply shown in a region of the first conductive type diffusion layer 140 of FIGS. 3 to 5 and I (a peak buried hole accumulation (BHA) concentration) in FIG. 7) of the impurity doping profile of the first conductive type diffusion layer 140 according to the above-mentioned ion injection may be positioned between a region below a second conductive type well layer 170 (See FIG. 6) and the lower surface of the secondary trench 130b based on the thickness direction of the device.

FIG. 7, which is a graph showing profiles of impurity doping concentrations of each region based on the line A-A' of the power semiconductor device of FIG. 6, shows a doping concentration of the N-type of each region, a doping concentration of the P-type of each region, and net doping of each region.

In this case, since the peak point of the impurity doping concentration of the first conductive type diffusion layer 140, which is the I region, is formed at a point spaced apart from the second conductive type well layer 170 by a predetermined distance based on the thickness of the power semiconductor device, the power semiconductor device (particularly, an insulated gate bipolar transistor (IGBT)) according to the preferred embodiment of the present invention may decrease a variation in a threshold voltage (Vth) in spite of a decrease in Vce(sat) at the time of operating thereof.

Here, the decrease in Vce(sat) means an increase in a concentration of the first conductive type diffusion layer 140.

That is, in the power semiconductor device 100 according to the preferred embodiment of the present invention, higher concentration impurities are injected as compared with the prior art to limit movement of the hole carriers, thereby making it possible to increase a switching speed of the power semiconductor device and improve the entire operation of the device.

In relation to this, it is to be considered in the process of forming the first conductive type diffusion layer 140 that the peak point of the impurity doping concentration at the time of injecting the ions is formed below the second conductive type well layer 170 (See FIG. 6) and does not deviate from the lower surface of the secondary trench 130b.

As shown in FIG. 3, the first conductive type diffusion layer 140 may be formed in a semicircular shape each at both sides of the primary and secondary trenches 130a and 130b (hereafter, referred to as 130) based on the primary and secondary trenches 130.

More specifically, the first conductive type diffusion layer 140 formed in a circular shape or an ellipse shape (except for the primary trench region) around the lower surface of the primary trench 130a as shown in FIG. 2 may be each formed in the semicircular shape by the processing of the secondary trench 130b.

Next, the etching resist 10 may be removed as shown in FIG. 4.

Next, a first insulating film 160 may be formed on one surface of the base substrate as well as inner walls of the primary and secondary trench 130, as shown in FIG. 5.

Here, the first insulating film 160 may be a gate oxide film, but is not limited thereto.

Next, a first electrode 165 may be formed in the primary and secondary trench 130 and a second conductive type well layer 170 may be formed on the first conductive type diffusion layer 140, as shown in FIG. 6.

Here, the first and second conductive types may be an N-type and a P-type, respectively, but are not limited thereto.

Referring to FIG. 6, the second conductive type well layer 170 may be a P-type well layer.

In addition, the first electrode 165 may be a gate electrode, but is not limited thereto.

Meanwhile, as shown in FIGS. 3 and 4, after the removing of the etching resist 10 and before the forming of the first insulating film 160, a second insulating film 150 may be formed on the base substrate as well as the inner walls of the primary and secondary trench 130 and be then removed.

Here, the second insulating film 150 may be a sacrificial oxide film.

The process of forming and removing the sacrificial oxide film, which is a process softly polishing a region of the primary and secondary trenches 130, is a process for softly processing damage such as a crack which may occur at the time of processing the trench and minimizing a defect which may subsequently occur.

As shown in FIG. 6, the primary and secondary trenches 130 may be plural.

Referring to FIG. 6, the method of manufacturing a power semiconductor device may include: after the forming of the second conductive type well layer 170, forming second electrode regions 190 on the second conductive type well layer 170 and on each of the outer wells of both sides of the plurality of primary and secondary trenches 130, forming a second conductive type body region 180 on the second conductive type well layer 170 and between the second electrode regions 190, the second conductive type body region 180 having a concentration higher than that of the second conductive type well layer 170, forming a third insulating film 191 on the primary trench 130a in one surface of the base substrate so as to contact a first insulating film 160 and a first electrode 165, and forming a second electrode 193 on one surface of the base substrate as well as the third insulating film 191.

The second electrode region 190 and the second electrode 193 as described above may be a first conductive type emitter region and an emitter electrode, respectively, but are not limited thereto.

Further, the second electrode region 190 and the second conductive type body region 180 may be an N+ type having the concentration higher than that of the NO type of the first conductive type diffusion layer 140 and a P+ type having the concentration higher than that of the P type of the second conductive type well layer 170, respectively, but are not limited thereto.

As shown in FIG. 6, the second electrode regions 190 may be plural and formed to be spaced apart from each other.

Next, a second conductive type semiconductor substrate 110 may be formed on the lower surface of the first conductive type drift layer 120 based on the thickness direction of the base substrate, as shown in FIG. 6.

The second conductive type semiconductor substrate 110 may be formed of a silicon wafer, but is not limited thereto.

Power Semiconductor Device

FIG. 6 is a view showing a configuration of a power semiconductor device according to the preferred embodiment of the present invention.

Here, the power semiconductor device will be described with reference to FIGS. 1 to 5 that are cross-sectional views sequentially showing processes of a method of manufacturing a power semiconductor device according to a preferred embodiment of the present invention and FIG. 7 that is a graph showing doping profiles of each region based on the line A-A' of the semiconductor device of FIG. 6.

As shown in FIG. 6, the power semiconductor device 100 may include: a base substrate having one surface and the other surface and formed of a first conductive type drift layer 120, a second conductive type semiconductor substrate 110 formed on the other surface of the base substrate, a first conductive type diffusion layer 140 formed on one surface of the base substrate and having a concentration higher than that of the first conductive type drift layer 120, a second conductive type well layer 170 formed on the first conductive type diffusion layer 140, a trench (130 in FIG. 3) formed so as to penetrate through the second conductive type well layer 170 and the first conductive type diffusion layer 140 from one surface of the base substrate including the second conductive type well layer 170 in a thickness direction, a first insulating film 160 (See FIG. 5) formed on one surface of the base substrate as well as an inner wall of the trench 130, and a first electrode 165 formed in the trench 130.

Here, the peak point (I in FIG. 7) of the impurity doping profile of the first conductive type diffusion layer 140 may be positioned at a region between a region below the second conductive type well layer 170 and the lower surface of the trench 130.

Further, the first and second conductive types may be an N-type and a P-type, but are not limited thereto.

Further, the first conductive type diffusion layer 140 may be formed in the semicircular shape each at both sides of the trench 130 based on the trench 130, as shown in FIGS. 3 to 6.

Further, the first insulating film 160 may be a gate oxide film.

Meanwhile, as shown in FIG. 6, the trench (130 in FIG. 3) may be plural.

The power semiconductor device 100 may further include: second electrode regions 190 formed on the second conductive type well layer 170 and each of the outer wells of both sides of the plurality of trenches 130, a second conductive type body region 180 formed on the second conductive type well layer 170 and between the second electrode regions 190 and having a concentration higher than the second conductive type well layer 170, a third insulating film 191 formed on the trench 130 of one surface of the base substrate so as to contact the first insulating film 160 and the first electrode 165, and a second electrode 193 formed on one surface of the base substrate as well as the third insulating film 191.

The second electrode region 190 may be a first conductive type emitter region and the second electrode 193 may be an emitter electrode.

Although not shown, the power semiconductor device 100 may include a third electrode (not shown) formed on a lower surface the second conductive type semiconductor substrate 110. The third electrode may be a collector electrode and the second conductive type semiconductor substrate 110 may be operated as a collector region.

In the power semiconductor device 100 according to the preferred embodiment of the present invention, since the first conductive type diffusion layer 140 having the concentration higher than that of the first conductive type drift layer 120 is formed and the peak point of the impurity doping region of the first conductive type diffusion layer 140 is positioned between the region below the second conductive type well layer 170 and the lower surface of the secondary trench 130, even though the same first conductive type impurity concentration is applied to the power semiconductor device 100, the power semiconductor device according to the present invention may have a voltage (Vce(sat)) lower than that of the power semiconductor device according to the prior art.

Due to the structure as described above, in the power semiconductor device 100 according to the preferred embodiment of the present invention, since the peak point of the impurity doping profile of the first conductive type diffusion layer 140 is formed to be spaced apart from the second conductive type well layer 170, a larger amount of hole accumulation occurs as compared with the prior art, thereby making it possible to implement excellent characteristics.

Further, in the power semiconductor device 100 according to the preferred embodiment of the present invention, since a variation in the threshold voltage in accordance with the increase in the first conductive impurity doping concentration is small, thereby improving a degree of freedom in a design in forming the power semiconductor device 100.

With the power semiconductor device and the method of manufacturing the same according to the preferred embodiment of the present invention, the first conductive type diffusion layer having the concentration higher than that of the first conductive type drift layer is formed between the first conductive type drift layer and the second well layer to limit the movement of the hole carrier, thereby making it possible to reduce the conduction loss of the power semiconductor device.

Further, according to the preferred embodiment of the present invention, the secondary trench processing is applied, such that the peak point of the impurity doping concentration of the first conductive type diffusion layer is formed to be spaced apart from the second conductive type well layer, thereby making it possible to reduce the variation in the threshold voltage at the time of operating the power semiconductor device including the insulated gate bipolar transistor (IGBT) device.

Although the embodiments of the present invention have been disclosed for illustrative purposes, it will be appreciated that the present invention is not limited thereto, and those skilled in the art will appreciate that various modifications, additions and substitutions are possible, without departing from the scope and spirit of the invention.

Accordingly, any and all modifications, variations or equivalent arrangements should be considered to be within the scope of the invention, and the detailed scope of the invention will be disclosed by the accompanying claims.

What is claimed is:

1. A power semiconductor device comprising:
    a base substrate having one surface and the other surface and formed of a first conductive type drift layer;
    a second conductive type semiconductor substrate formed on the other surface of the base substrate;
    a first conductive type diffusion layer formed on one surface of the base substrate and having a concentration higher than that of the first conductive type drift layer;
    a second conductive type well layer formed on the first conductive type diffusion layer;
    a trench formed so as to penetrate through the second conductive type well layer and the first conductive type diffusion layer from one surface of the base substrate including the second conductive type well layer in a thickness direction;
    a first insulating film formed on one surface of the base substrate as well as an inner wall of the trench; and
    a first electrode formed in the trench,
    wherein a peak point of an impurity doping profile of the first conductive type diffusion layer is positioned between a region below the second conductive type well layer and a lower surface of the trench.

2. The power semiconductor device as set forth in claim 1, wherein the first conductive type is an N-type and the second conductive type is a P-type.

3. The power semiconductor device as set forth in claim 1, wherein the first conductive type diffusion layer is formed in a semicircular shape at each of both sides of the trench based on the trench.

4. The power semiconductor device as set forth in claim 1, wherein the first insulating film is a gate oxide film.

5. The power semiconductor device as set forth in claim 1, further comprising:
    a second electrode region formed on the second conductive type well layer and the outer well of both sides of the trench;
    a second conductive type body region formed on the second conductive type well layer and between the second electrode regions and having a concentration higher than the second conductive type well layer;
    a third insulating film formed on the trench of one surface of the base substrate so as to contact the first insulating film and the first electrode; and a second electrode formed on one surface of the base substrate as well as the third insulating film.

6. The power semiconductor device as set forth in claim 5, wherein the second electrode region is a first conductive type emitter region, and the second electrode is an emitter electrode.

\* \* \* \* \*